United States Patent [19]

Polichette et al.

[11] 3,956,041

[45] May 11, 1976

[54] TRANSFER COATING PROCESS FOR MANUFACTURE OF PRINTING CIRCUITS

[75] Inventors: Joseph Polichette, South Farmingdale; Edward J. Leech; Frederick W. Schneble, Jr., both of Oyster Bay, all of N.Y.

[73] Assignee: Kollmorgen Corporation, Hartford, Conn.

[22] Filed: Aug. 23, 1974

[21] Appl. No.: 499,986

Related U.S. Application Data

[63] Continuation-in-part of Ser. No. 270,660, July 11, 1972, abandoned.

[52] U.S. Cl. ................................. 156/3; 29/625; 156/237; 156/238; 156/241; 156/246; 174/68.5; 204/30; 252/79.2; 427/96; 427/304; 427/306; 427/331; 427/352; 428/901

[51] Int. Cl.² ...................... H05K 3/18; B05D 7/24; C23C 3/02; H05K 3/00

[58] Field of Search .......... 156/247, 249, 246, 230, 156/237, 241, 235, 238; 117/212, 218, 72, 76 A; 29/62.5; 174/68.5; 317/101 B; 427/98, 96, 306, 304, 261, 331, 352, 407, 411; 428/901; 204/30, 38 B, 38 E; 252/79.2

[56] References Cited
UNITED STATES PATENTS

| 3,539,424 | 11/1970 | Tashlick | 156/247 X |
|---|---|---|---|
| 3,551,241 | 12/1970 | Heeb et al. | 156/230 |
| 3,575,754 | 4/1971 | Duerden et al. | 156/247 X |
| 3,625,758 | 12/1971 | Stahl et al. | 117/72 X |
| 3,650,880 | 3/1972 | Tieniber | 156/247 X |
| 3,713,935 | 1/1973 | Grecchi | 156/294 X |
| 3,799,802 | 3/1974 | Schneble, Jr. et al. | 117/212 |

*Primary Examiner*—William A. Powell
*Assistant Examiner*—Thomas Bokan
*Attorney, Agent, or Firm*—Morgan, Finnegan, Pine, Foley & Lee

[57] ABSTRACT

There is provided a process for producing resin rich surfaces of desired and specified thickness and physical, chemical, electrical and/or optical properties involving the use of a transfer base material to move a viscous, liquid, hardenable composition after partial hardening into a non-tacky state into contact with the surface of a second, permanent base, completing the hardening of the composition into a resin-rich surface layer adhering to the second base and subsequently removing the transfer base therefrom. In specific embodiments, the permanent base itself can be hardenable and complete hardening is effected simultaneously; the surface layer can be an adhesive layer; and the surface layer can be catalytic throughout to electroless metal deposition.

9 Claims, 4 Drawing Figures

3,956,041

TRANSFER COATING PROCESS FOR MANUFACTURE OF PRINTING CIRCUITS

This application is a continuation-in-part application of U.S. application Ser. No. 270,660 filed July 11, 1972 now abandoned.

This invention relates to novel and improved methods for the manufacture of articles provided with a surface of certain specified and desired mechanical, chemical, electrical and optical properties. In its most preferred embodiments, it relates to a transfer process for applying a resin rich surface layer to a laminate during manufacture.

It is a primary object of the invention to produce bases having surfaces of controlled properties.

Another object of this invention is to produce coated substrates which can withstand atmospheric or corrosive effects and/or rough mechanical handling and/or possess surface properties which are independent of the base material.

A further object is to provide resin rich surfaces on substrates for metallization, the substrates being uniquely suitable for production of highly adherent bonds between the metal and the base.

Another object is the manufacture of improved printed circuits.

Other objects and advantages of the invention will be set forth in part herein and will be obvious herefrom or may be learned by practice of the invention.

BACKGROUND OF THE INVENTION

It is known to achieve certain surface properties by providing resin rich surface layers, e.g., by lacquering. The finish and properties achieved depend on the properties of the lacquer used. Moreover, dust accumulated during the hardening period is a major problem in producing perfect, smooth and uniform surfaces, to which, for example, subsequent steps may be applied with predictable results. Lacquer coating is also completely inadequate to provide resin rich surface layers of the thickness generally required for the production of printed circuits.

It is also known to provide a resin rich surface layer on prints made on paper or other materials by laminating or gluing a suitable plastic foil to the surfaces of such materials. One of the main defects of this concept is the tendency to delaminate in use or after exposure to heat.

Additive processes to make printed circuitry require a uniform resin rich surface layer of at least 0.75 mil. (20 microns) thick to insure strong and uniform adhesion of electroless metal deposits and provide smooth surfaces for imaging processes. Heretofore, sheet sized laminates cut into panels (e.g., 4 × 8 feet) were coated individually by a variety of methods including roller coating, dip coating and curtain coating. Such methods lack thickness control and are difficult to use in production because of the need to handle a large number of sheets.

These and other disadvantages of the prior art are overcome by the present invention.

DESCRIPTION OF THE INVENTION

Figure 1:
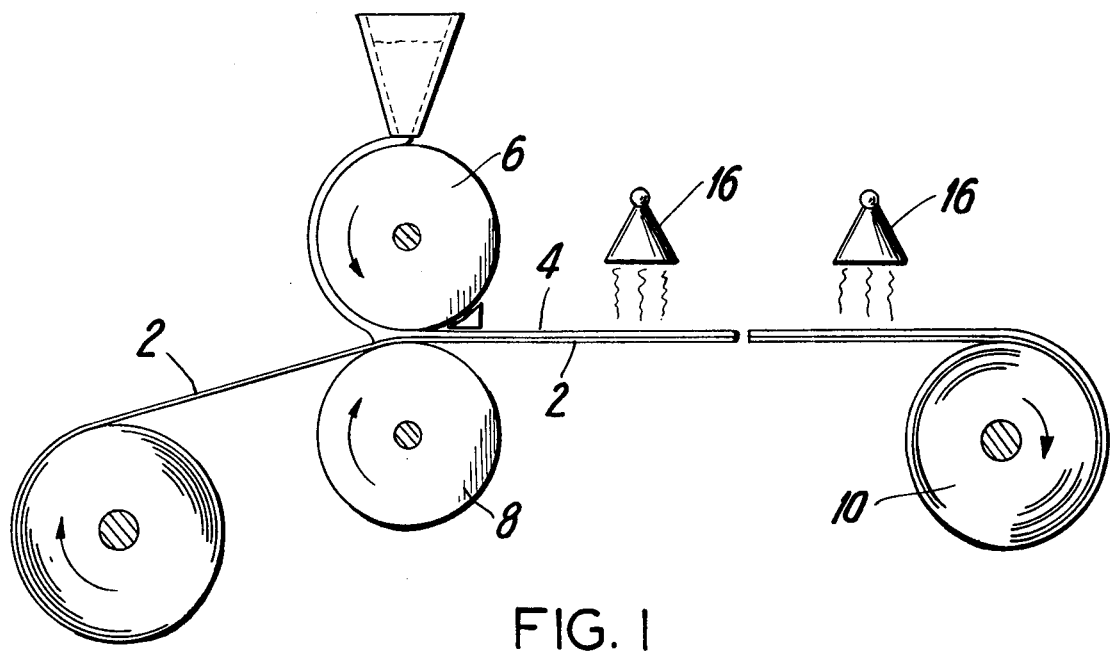
FIG. 1 illustrates a production process apparatus for coating a transfer base in a roll to roll fashion with a hardenable resinous layer.

According to this invention a process for producing a new article of manufacture having a resin rich surface layer of controlled thickness and pre-determined mechanical, chemical, electrical and optical properties has been discovered which comprises coating the surface of a transfer base material with a layer of a viscous, liquid incompletely polymerized composition hardenable by polymerization or cross-linking, the transfer base material not adhering to the coating layer in its hardened state, partially hardening the composition to a degree whereby adjacent coated surfaces will not adhere to each other, thereafter bringing the partially hardened coated surface of the transfer base material into close contact with the surface of a permanent base material, the permanent base material adhering to the coating layer in its hardened state, completing the hardening of the coating layer by polymerization or cross-linking, and subsequently removing the transfer base material.

Preferably the coating composition is applied in a solvent free or substantially solvent free state, and is incompletely polymerized. It is important then to partially harden, i.e., to the "B-stage" to produce a nontacky, and not completely hardened surface. This permits the coated transfer material (i) to be rolled up without danger of forming into one "frozen" block which cannot be unrolled thereafter; (ii) it avoids the danger of the resin bleeding through this layer; and (iii) it simplifies the manufacturing process with permanent bases having different top layers of resin compositions, such as epoxies, adhesives, etc., intermingling being prevented.

Preferred materials for the transfer base may be selected from sheet materials, films or foils, e.g., plastic- or metal-coated paper, such as silicone coated paper, polyethylene coated paper, or aluminized paper, or plastics, such as polyethylene, poly(vinyl chloride), poly(vinyl fluoride), polyesters, e.g., poly(alkylene terephthalates), or metals themselves, such as aluminum, tin, copper and the like.

In certain cases, it may be advisable to employ a mold release agent, i.e., a conventional wax or silicone spray, for facilitating stripping of the transfer base material after the coating has been hardened.

In preferred embodiments, the resin rich surface of the permanent base (after removal of the transfer base) is adapted to receive adherent electroless metal deposits; it is an adhesive.

In other preferred embodiments the resin-rich surface layer, which may or may not be an adhesive layer per se, may be subsequently treated by known methods to render it permanently polarized, and microporous. This provides an activated base for metallizing with improved bond strengths.

Polarization and wettability is produced, for example, by treating the hardened resin surface first with a preactivating agent, e.g., dimethyl formamide, dimethyl sulfoxide, a mixture of toluene and water, depending on the nature of the hardened resin, then with an activator, such as chromic acid-sulfuric acid, and then with a reducing agent, such as sodium bisulfite, the results of which treatment is to produce a permanently polarized, wettable surface.

Such techniques, including electroless metallization techniques, are disclosed in greater detail, for example, in copending U.S. patent application Ser. No. 227,678, filed Feb. 18, 1972, which was abandoned in favor of continuation application Ser. No. 477,427 filed June 7, 1974, the disclosure of which is incorporated herein by reference.

On the other hand, the hardenable composition can be partially degradable, or contain degradable particles, such as particles of resins, having degradable sites, and on treatment with suitable agents, such as chromic acid, or permanganate, is caused to become microporous and thus activated to obtain adherent metal deposits.

Such compositions and techniques, including the electroless metallization technology are disclosed in greater detail, for example, in U.S. Pat. No. 3,625,758, the disclosure of which is incorporated herein by reference.

The range of suitable coating materials is not limited to the ones mentioned above; the material may be a monomer combination, a catalyzed monomer, a catalyzed mixture of a monomer and polymer, a two-component composition, and the like. Preferred resins will be phenolics, polyepoxides, melamines, polyacrylics, polyacrylates, polyesters, nitrile rubber, curable polystyrene resins and mixtures of the foregoing.

The preferred reaction for the hardening or curing of these resins is one which is initiated by heat. The resins referred to above are all curable by heat without the need to modify the polymer or add initiators such as is in the case of, for example, ultraviolet initiated reactions.

In the preferred embodiment of the invention, the permanent base material itself is also hardenable by heat initiated polymerization or cross-linking and the coating layer and the base material are hardened simultaneously before removing the transfer base material.

In other preferred embodiments, the coating layer or the resin rich surface which has been simultaneously hardened with the base will be catalytic throughout to the deposition of electroless metal from electroless metal solutions in contact therewith. These surfaces avoid the need for treatment with sensitizing baths to render them catalytic and thus simplify the manufacturing process and they facilitate the production of printed circuits because holes drilled therein have catalytic walls upon which conductive layers of metal can be built up by immersion in electroless metal baths. It is also contemplated that materials which are catalytic throughout to the deposition of electroless metal may be employed as permanent bases.

There may be used a hardenable catalytic composition of the type described, for example, in U.S. Pat. No. 3,226,256 and in Canadian Pat. No. 895,590, both of which are incorporated herein by reference. In essence, the composition will comprise a dispersion of an adhesive resin base and finely divided particles of an agent which is receptive to electrolessly deposited metal, e.g., metals or oxides of metals, including titanium, aluminum, copper, iron, cobalt, zinc, e.g., titanous oxide, copper oxide, or mixtures of the foregoing, as well as other metals in Groups IB, IV and VII of the Periodic Table of Elements, or salts, complexes or oxides thereof such as chlorides, bromides, fluorides, ethyl acetoacetates, fluoroborates, iodides, nitrates, sulfates, acetates, and oxides of such metals. Especially useful are palladium, gold, platinum, copper, palladium chloride, gold chloride, platinum chloride, copper oxide and stannous chloride. The amount of the catalytic compound dispersed in the hardened coating or resin-rich layer will usually vary from about 0.001 to 25% by weight. Preferably, the concentration of the catalytic compound will be below 10% by weight.

Referring to FIG. 1, such a method is useful in large scale lamination by first coating transfer sheet 2 with the required resin layer 4 in roll 6 to roll 8 fashion, and rolling up the coated sheet (the resin layer still being partially hardened to the B-stage by heating, for example, with lamps 16) onto roll 10 for later use. Next the required sheet size (usually 3 × 4 feet) is cut off and then combined with a plurality of pre-preg core stock sheets and consolidated under heat and pressure in a laminating press.

Figure 2:
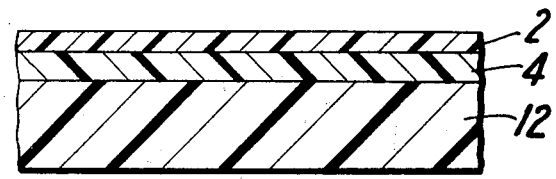
FIGS. 2, 3 and 4 show cross section views, respectively, of a resinous base coated with a hardened resinous layer and a transfer base on top, then such a base with the transfer layer removed, and then such a base with the exposed, hardened resin rich surface activated for bonding subsequent metallic deposits firmly thereto.
Figure 3:
Figure 4:
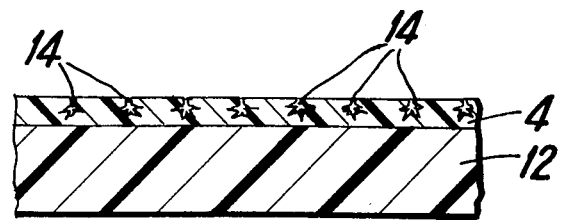

The article removed from the press appears as shown in cross section in FIG. 2, and comprises transfer base 2, permanent base 12 and hardened coating layer 4. FIG. 3 shows the coated base after the transfer base has been stripped. FIG. 4 shows a preferred embodiment, wherein there are provided micropores 14 in the surface layer. These fill with metal during subsequent metallization steps, if used, and facilitate adhesion of the metal layer to the resin rich surface. The transfer sheet can be used as both the applicator of the hardenable resin system to the pre-preg and as a release in the press.

In laminate manufacture, the benefits of the instant process are as follows:

i. minimum resin rich likeness requirements can easily be met by a slight overdose of wet film thickness avoiding the somewhat problematic nature of solution coating individual panels;

ii. large scale roll to roll coating is much faster and more economical than individually coating panel size pieces;

iii. such processing fits directly into existing laminate production equipment and processes;

iv. a more dense and smooth surface layer is produced which is free of pin holes, less subject to damage in handling, has improved resolution in imaging processes and subsequently deposited metal will have higher peel strength than when applied to a solution coated panel;

v. transfer sheet processing permits the use of a different surface layer resin system than that which is used within the laminate (Previous attempts at coating phenolic pre-pregs with surface layer resins were subject to bleed through and mixing of the pre-preg resin with the surface layer resin. Because the pre-preg resin is not activated for adhesion in the manner prescribed for the applied surface layer, unpredictable and low peel strengths were often obtained after metallizing.);

vi. producers of flame retardant laminates with resin rich surfaces can use the instant process to advantage (Concurrently employed expedients involve double and triple dipping of the glass cloth which inherently has a poor pickup); substituting a fine weave cloth which has better pickup; adding fumed silica to increase resin pickup; and carefully controlling flow through difficult and expensive adjustments of drying conditions and catalysts; and vii. the transfer sheet material may be one purposely selected to cling to the applied surface layer of resin in order to provide slip sheeting for stacking as well as protection during panel cutting, punching and drilling (If not peelable by hand, the transfer base material can be chemically removable, as would be the case with aluminum foil).

DESCRIPTION OF THE PREFERRED EMBODIMENTS

The following examples illustrate the processes of this invention. They are not to be construed as limiting.

EXAMPLE 1

A transfer base comprising a polyethylene coated paper is coated and dried in an apparatus via roll to roll processing with a layer of hardenable rubber base composition (modified from Example II of U.S. Pat. No. 3,625,758) comprising:

| | |
|---|---|
| methyl ethyl ketone$^a$ | |
| cellusolve acetate$^b$ | |
| nitrile rubber, liquid | 350 g. |
| nitrile rubber, in lumps | 590 g. |
| thermosetting oil-soluble phenolic resin | 350 g. |
| epoxy resin (epichlorohydrin derivative) | 400 g. |
| fumed colloidal silica | 300 g. |
| butyl carbitol$^c$ | |

Enough solvent at a weight ratio of a:b:c of about 1:5.7:4.4 is used to give a viscosity of about 12,000 cps.

Three by 4 foot sheets are cut off the roll and arranged in a stack with a plurality of phenolic-paper or glass-epoxy pre-preg core stock sheets so that the resin layer to be applied faces the laminate pre-preg.

The composite is laminated under conventional conditions (phenolic pre-preg — 1000 to 1500 psi at 340°F. for 45 minutes, epoxy pre-preg — 200 to 275 psi at 340°F. for ¼ to ½ hr.).

Panels cut from the sheet laminates having the resin rich surface layer are processed into printed circuit boards as follows:

i. any required hole pattern is produced;
ii. the transfer base material is removed, e.g., by peeling off;
iii. the surface is activated for 30 minutes at 23°-27°C.

| | |
|---|---|
| K$_2$Cr$_2$O$_7$ | 37 g. |
| H$_2$SO$_4$ | 500 ml. |
| Water | 500 ml. | iv. the surface is sensitized by treatment with a solution of 100 g. of SnCl$_2$, 55 ml. of HCl (conc.) and 1000 ml. of water, rinsed and subjected to a bath which consists of PdCl$_2$, 1 g., HCl (conc.) 40 ml., and 1000 ml. of water;
v. dry and then a conventional background resist is applied;
vi. electroless copper is deposited from a conventional bath (e.g., U.S. Pat. No. 3,625,758, Example V) to a desired thickness, to produce the conductor pattern;
vii. the resist is stripped; and
viii. the finished circuit board is post-cured for 30 minutes at 320°F.

EXAMPLE 2

Instead of the poly(acrylonitrile-butadiene) rubber based surface coating, an epoxy resin coating (e.g., epichlorohydrin-bisphenol-A catalyzed with diethylenetriamine) is applied via the transfer process. After curing, producing any desired holes and peeling off the transfer base, the surface is rendered permanently polarized and wettable by immersion in dimethyl formamide at 80°F. for 2–5 minutes, rinsed in water, immersed in a solution of 100 g./l. CrO$_3$, 250 ml./l. of concentrated sulfuric acid, balance water, for about 1 minute, immersed in a 5% solution of NaHSO$_3$ for about 2 minutes, then rinsed in cold water, followed by rinsing in hot (160°F.) water and air or oven dried. Then the activated base is sensitized, e.g., with a soluble reaction product of PdCl$_2$-SnCl$_2$ (see, Ser. No. 801,167, filed Feb. 20, 1969, now U.S. Pat. No. 3,672,938 issued June 27, 1972), reverse-masked, an electroless copper conductor pattern is built up to the desired thickness, the mask is removed and the printed circuit board is post-cured as above-described.

EXAMPLE 3

A catalytic throughout resin-rich surface layer is applied by the process of Example 1 using as the hardenable composition (U.S. Pat. No. 3,226,256, Example 9):

| | grams |
|---|---|
| Epoxy resin$^a$ | 15 |
| butadiene-acrylonitrile rubber | 15 |
| diacetone alcohol | 50 |
| toluene | 50 |
| phenol formaldehyde resin (oil soluble) | 11 |
| cuprous oxide (catalyst) | 60 |

Epoxy resin (a) is DER 332 sold by Dow Chemical Co., and is the reaction product of epichlorohydrin and bisphenol-A. Epoxy equivalent is 173 to 179, average molecular weight is 340 to 350 and viscosity at 25°C. is 3600 to 6400. The other ingredients are fully described in the referred patent.

Instead of a copper bath, other Group IB and VIII electroless metal baths can be used, e.g., the nickel baths described in Brenner, Metal Finishing, Nov. 1954, pages 68–76, or the gold baths disclosed in U.S. Pat. No. 2,976,181. Likewise, cobalt, silver, and other baths are well known to those skilled in this art and can be used.

The invention is not limited to printed circuit boards or to the specific steps and methods described.

What is claimed is:

1. A process for the manufacture of printed circuits having improved adhesion between the metallic circuit conductor pattern and an insulating base, which comprises coating the surface of a transfer base material with a layer of a viscous, liquid incompletely polymerized composition containing a resin hardenable by polymerization or cross-linking, said resin selected from the group consisting of phenolics, polyepoxides, melamines, polyacrylics, polyacrylates, polyesters, nitrile rubber, curable polystyrene resins, and mixtures thereof, said transfer base material being removable from the coating layer in its hardened state, partially hardening the composition to a degree whereby adjacent coated surfaces will not adhere to each other, thereafter bringing the partially hardened coated surface of said transfer base material into close contact with the surface of a permanent insulating base material, said permanent insulating base material adhering to the coating layer in its hardened state, completing the hardening of said coating layer by heating, removing the transfer base material to produce an insulating base material having a resin rich, hardened coating layer, producing either a permanently polarized, wettable surface or a microporous surface on the hardened coating layer on said insulating base, and generating a metallic conductor pattern in selected areas on the permanently polarized, wettable or microporous surface of the hardened coating on the insulating base.

2. The process as defined in claim 1 wherein said permanent base material is itself hardenable by polymerization or cross-linking and the partially hardened coating layer and the base material are completely hardened simultaneously by heat before removing said transfer base material.

3. The process as defined in claim 1 wherein the transfer base comprises a sheet, film or foil of plastic- or metal-coated paper, polyethylene, poly(vinyl chloride), poly(vinyl fluoride), poly(alkylene terephthalate), poly(tetrafluoroethylene), aluminum, copper or tin.

4. The process as defined in claim 1 wherein the resin rich, hardened coating layer is catalytic throughout to the deposition of electroless metal from solutions in contact therewith.

5. The process as defined in claim 1 wherein the coating layer is adapted to receive adherent electroless metal deposits.

6. The process as defined in claim 5 wherein the coating layer is catalytic throughout to the deposition of electroless metal from solutions in contact therewith.

7. The process as defined in claim 1 wherein the permanent base material is catalytic throughout to the deposition of electroless metal from solutions in contact therewith.

8. The process as defined in claim 1 wherein said resin is an epoxy resin.

9. The process as defined in claim 1 wherein a mold-release material is provided between the surface of the coating layer and the material of the transfer base.

* * * * *